United States Patent
Withers et al.

(10) Patent No.: US 11,684,144 B2
(45) Date of Patent: Jun. 27, 2023

(54) HYBRID MATERIAL POST-CMP BRUSHES AND METHODS FOR FORMING THE SAME

(71) Applicant: Illinois Tool Works Inc., Glenview, IL (US)

(72) Inventors: Bradley Scott Withers, El Dorado Hills, CA (US); Yuyan Luo, El Dorado Hills, CA (US); Erik Scott Nelson, Granite Bay, CA (US); Brent Allan Best, Rocklin, CA (US)

(73) Assignee: Illinois Tool Works Inc., Glenview, IL (US)

( * ) Notice: Subject to any disclaimer, the term of this patent is extended or adjusted under 35 U.S.C. 154(b) by 434 days.

(21) Appl. No.: 16/890,535

(22) Filed: Jun. 2, 2020

(65) Prior Publication Data

US 2020/0288857 A1  Sep. 17, 2020

Related U.S. Application Data

(63) Continuation of application No. 15/712,212, filed on Sep. 22, 2017, now abandoned.

(51) Int. Cl.
*A46B 9/06* (2006.01)
*H01L 21/67* (2006.01)
(Continued)

(52) U.S. Cl.
CPC ............... *A46B 9/06* (2013.01); *A46B 9/005* (2013.01); *A46D 3/00* (2013.01); *B29C 45/1615* (2013.01); *H01L 21/02057* (2013.01); *H01L 21/02096* (2013.01); *H01L 21/67046* (2013.01); *A46B 13/02* (2013.01); *A46B 2200/3073* (2013.01);
(Continued)

(58) Field of Classification Search
CPC ............ A46B 13/02; A46B 9/06; H01L 21/67
See application file for complete search history.

(56) References Cited

U.S. PATENT DOCUMENTS

| | | |
|---|---|---|
| 5,903,951 A | 5/1999 | Ionta |
| 2002/0100132 A1 | 8/2002 | McMullen |
| (Continued) | | |

FOREIGN PATENT DOCUMENTS

| | | |
|---|---|---|
| EP | 1680260 | 7/2006 |
| WO | 2005016599 | 2/2005 |

OTHER PUBLICATIONS

Communication pursuant to Article 94(3) EPC for European Application No. 18 763 005.8, dated Jan. 28, 2022, European Patent Office, Netherlands (5 pages).

(Continued)

*Primary Examiner* — Michael D Jennings
(74) *Attorney, Agent, or Firm* — McAndrews, Held & Malloy, Ltd.

(57) ABSTRACT

Provided is disclosure for hybrid material post-CMP brushes and methods for forming the same. Embodiments of a hybrid material post-CMP brush may comprise at least two layers, where the hybrid brush is used to clean various surfaces, such as surfaces of semiconductor substrates. An example hybrid brush for cleaning a surface includes a mandrel, a molded first layer formed about the mandrel, where the molded first layer comprises a first material, and a molded second layer surrounding the molded first layer, where the molded second layer comprises a second material.

20 Claims, 8 Drawing Sheets

(51) Int. Cl.
- *A46B 9/00* (2006.01)
- *A46D 3/00* (2006.01)
- *B29C 45/16* (2006.01)
- *H01L 21/02* (2006.01)
- *A46B 13/02* (2006.01)
- *B08B 3/10* (2006.01)
- *B29K 31/00* (2006.01)
- *B29L 31/42* (2006.01)

(52) U.S. Cl.
CPC .............. *B08B 3/10* (2013.01); *B29K 2031/04* (2013.01); *B29L 2031/42* (2013.01)

(56) References Cited

U.S. PATENT DOCUMENTS

| | | |
|---|---|---|
| 2006/0276108 A1 | 12/2006 | Benson |
| 2010/0212702 A1 | 8/2010 | Hamada |
| 2011/0277789 A1 | 11/2011 | Benson |
| 2012/0247508 A1 | 10/2012 | Jeung |
| 2014/0287663 A1 | 9/2014 | West |
| 2016/0090704 A1* | 3/2016 | Smith ................. A46B 13/02 15/82 |
| 2017/0001345 A1 | 1/2017 | Kunz |
| 2017/0001403 A1 | 1/2017 | Kunz |

OTHER PUBLICATIONS

The Search Report and Written Opinion, dated Oct. 2, 2020, in Singapore application No. 11202001523W, filed on Aug. 23, 2018 (15 pages).

Int'l Search Report and Written Opinion Appln No. PCT/US2018/047645 dated Nov. 16, 2018 (13 pgs).

Search Report and translation, dated Jun. 15, 2021, for Taiwan Invention Patent Application No. 107133395, filed Sep. 21, 2018 (2 pages).

* cited by examiner

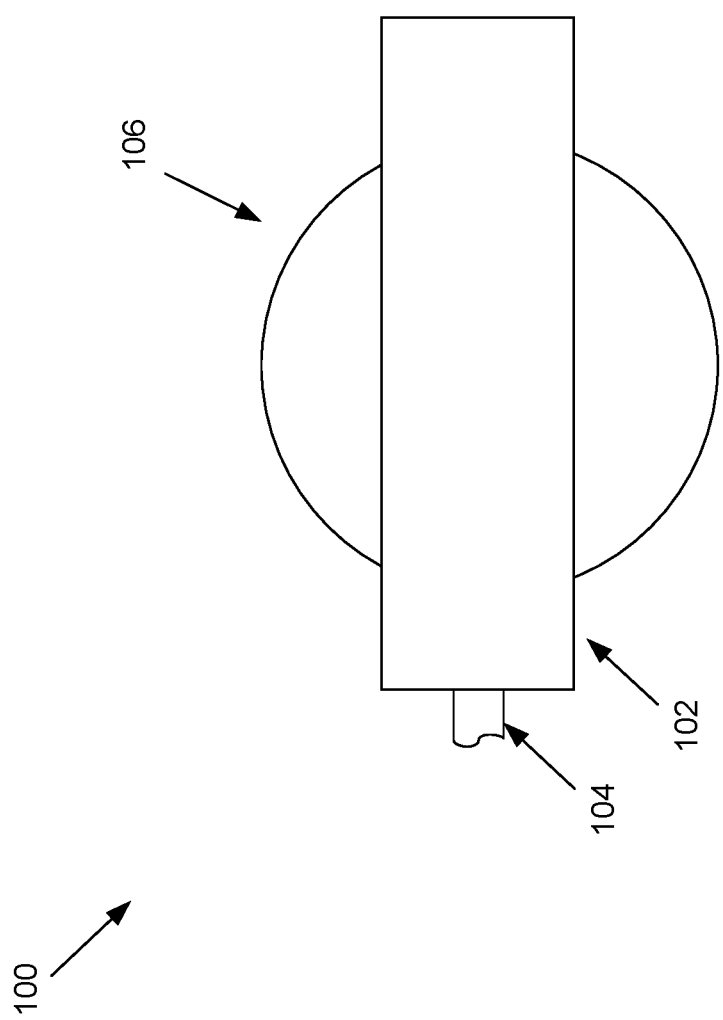

HYBRID MATERIAL POST-CMP BRUSHES AND METHODS FOR FORMING THE SAME

RELATED APPLICATIONS

The present application is a continuation of U.S. application Ser. No. 15/712,212 titled "Hybrid Material Post-CMP Brushes and Methods for Forming the Same" and filed on Sep. 22, 2017, and from which the present application claims priority to and benefit from. The contents of the above application is hereby incorporated herein by reference in its entirety.

BACKGROUND

The present disclosure relates to brushes for cleaning substrates, and more particularly, to hybrid material post-CMP brushes and methods for forming the same.

In the semiconductor manufacturing industry and other industries, brushes are used to remove contaminants from surfaces, such as from semiconductor wafers. Conventional brushes are not received from the manufacturer in a condition to be used immediately. Instead, brushes are typically conditioned (or "broken in") before use on the intended products to remove particulates from the brush.

Limitations and disadvantages of conventional brushes will become apparent to one of skill in the art, through comparison of such approaches with some aspects of the present method and system set forth in the remainder of this disclosure with reference to the drawings.

SUMMARY

The present disclosure discloses hybrid material post-CMP brushes and methods for forming the same, substantially as illustrated by and described in connection with at least one of the figures, and as set forth more completely in the claims.

BRIEF DESCRIPTION OF THE DRAWINGS

These and other aspects will become apparent and more readily appreciated from the following description of the exemplary embodiments, taken in conjunction with the accompanying drawings.

FIG. 1 illustrates an example illustration of a hybrid brush cleaning a surface, in accordance with aspects of this disclosure.

The figures are not necessarily to scale. Where appropriate, similar or identical reference numbers are used to refer to similar or identical components.

DETAILED DESCRIPTION

Figure 2A:
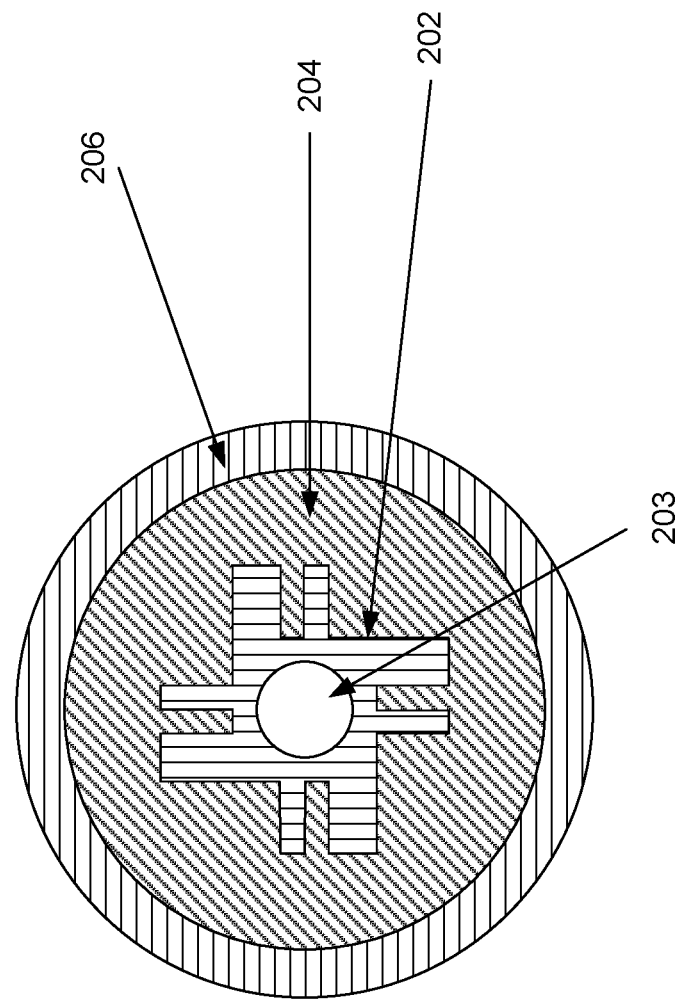
FIG. 2A illustrates a cross-section view of an example hybrid brush, in accordance with aspects of this disclosure.

Various applications may benefit from physical cleaning of a surface. For example, in semiconductor manufacturing a semiconductor wafer may be cleaned to remove potentially destructive contaminants during one or more stages of fabricating electronic circuits on the wafer. The cleaning can be provided by, for example, a brush that comes in contact with the surface to be cleaned. Other surfaces of devices used in electronic systems may also benefit from cleaning. This may be, for example, where one layer needs to be cleaned before another layer can be put on top of it. For example, display screens and/or touch screens may make use of a cleaning process before adding a next layer.

Accordingly, while it should be understood that various embodiments of the disclosure may be used for different applications, example references in this disclosure will be made to brushes for cleaning a surface of a semiconductor wafer for ease of description.

During a manufacturing process for a semiconductor wafer, a large number of contaminants may be found on the semiconductor wafer surface in the form of, for example, organic and/or inorganic particles. These contaminants may lead to device failure and poor wafer yields. Moreover, with each new semiconductor technology node, the critical size of the defects on the semiconductor wafer and the tolerable number of defects on the semiconductor wafer becomes smaller.

The semiconductor industry may use post-chemical mechanical planarization (pCMP) cleaning in the manufacture of semiconductor devices where brushes, such as, for example, polyvinyl acetate (PVAc) brushes, may be used in combination with application-specific cleaning agents and/or chemicals to remove particles from the semiconductor wafer surface.

The various brush types, including PVAc brushes, by nature of the material itself and/or the brush manufacturing/shipping process, will naturally release particles (organic or inorganic) when flushed and/or exposed to a fluid such as, for example, deionized water (DIW) and/or cleaning agents/chemicals. The quantity of particles released can be related to the nature of the fluid (DIW, cleaning agent, etc.) that the brush is exposed to, as well as the process conditions that the brush is used for (e.g., fluid flow rates, brush rotational speeds, etc.).

The actual semiconductor layer being processed may dictate the tolerable levels and/or sizes of particles that are released from the brush, and, hence, the time required to condition a brush. The time required for conditioning a brush may range from 10 minutes to 24 hours or more. The resulting lost productivity and correspondingly higher running costs are detrimental to the end-user. Accordingly, a hybrid brush that reduces the conditioning time and/or release of particles during use may be useful.

Disclosed are example hybrid brushes that may release fewer contaminants, and example methods for manufacturing such hybrid brushes.

FIG. 1 illustrates an example illustration of a hybrid brush cleaning a surface, in accordance with aspects of this disclosure. Referring to FIG. 1, there is shown a cleaning system 100 comprising a hybrid brush 102, where the hybrid brush 102 is cleaning a semiconductor substrate 106. The hybrid brush 102 may be rotated by a motor (not shown) that is connected to an axle 104. When the axle 104 rotates, the hybrid brush 102 also rotates, thereby cleaning the surface of the semiconductor substrate 106. In various embodiments, fluid may be introduced via the axle 104 to flow outward to the surface of the hybrid brush 102, the fluid may be introduced to a surface of the hybrid brush 102, and/or the fluid may be introduced to a surface of the semiconductor substrate 106. While not shown, a system may have two hybrid brushes 102 on either side of the semiconductor device 106 (or any other device) so that both sides can be cleaned at the same time.

FIG. 2A illustrates a cross-section view of an example hybrid brush, in accordance with aspects of this disclosure. Referring to FIG. 2A, there is shown an example hybrid brush 200 with a mandrel 202, a first layer 204, and a second layer 206. The hybrid brush 200 may be used to implement the hybrid brush 102 in the cleaning system 100 of FIG. 1. The mandrel 202 has a central opening 203 that allows an axle, such as, for example, the axle 104, to fit into the opening 203 such that when the axle 104 rotates, the hybrid brush 200 can also rotate.

The hybrid brush 200 may additionally be fastened to the axle 104 by a fastening mechanism such as, for example, a clip, the axle snapping into the opening 203, a protrusion in the axle 104 and/or the opening 203 providing force against each other to keep the axle 104 and hybrid brush 200 together, nuts at one of ends of the hybrid brush 200 to hold it in place on the axle 104, etc.

The example first layer 204 is formed or fastened onto the mandrel 202, and the second layer 206 is formed or fastened on to the first layer 204. In various embodiments, the second layer 206 may be denser or less compressible. The first layer 204 and the second layer 206 may be such that more force is required to compress the second layer 206 than the first layer 204. In some embodiments, the two layers 204 and 206 may be formed of similar material except that the second layer 206 is formed to be denser than the first layer 204. In some other embodiments the second layer 206 may be formed from another material that is denser than the first layer 204. Accordingly, it may be said generally that the first layer 204 may compress with less force than the second layer 206.

For example, the layers 204 and 206 may comprise different PVAc formulations, or two different materials such as, for example, PVAc for the second layer 206 and polyurethane (PU), polyethylene (PE), polypropylene (PP), polytetrafluoroethylene (PTFE), polyvinylidene fluoride (PVDF), ethylene vinyl acetate (EVA), etc., for the first layer 204.

In some embodiments, the second layer 206 includes a starch templating agent while the first layer 204 omits the starch templating agent. The starch templating agent may be useful, for example, in cleaning a surface of a substrate. However, the second layer 206 may also use other suitable material in place of starch. Furthermore, in some embodiments the first layer 204 may comprise material where a force needed to compress the molded first layer is substantially the same when the molded first layer is dry as when it is wet with a cleaning fluid used for cleaning the surface. The cleaning fluid may comprise, for example, deionized water or ultrapure water, or other suitable fluids for cleaning surfaces in general, or cleaning a specific surface in particular.

In some examples, the first layer 204 and the second layer 206 each include pores, where the pores in the first layer 204 are different in size and/or have a different pore layout pattern than pores in the second layer 206. For example, the first layer 204 may have larger pores and/or more numerous pores than the second layer 206. The pore size and distribution may be designed, for example, to allow better fluid distribution in the first layer 204 versus the second layer 206. The first layer 204 and the second layer 206 may also have different thicknesses depending on, for example, the amount of pressure the second layer 206 may be exposed to when cleaning a substrate such as, for example, the substrate 106, the density of the second layer 206, and other design and/or usage parameters. The thicknesses of the first layer 204 and the second layer 206 may be independent from each other.

The hybrid brush 200 may be manufactured in various ways. For example, the hybrid brush 200 may have both layers 204 and 206 molded, only one of the layers 204 and 206 molded and the other of the layers 204 and 206 fastened, or both layers 204 and 206 fastened. Fastening may use any suitable technology including, for example, adhesives, sewing, stretch fitting an outer layer over an inner layer, having hooks on an outer surface of the first layer 204 and loops on an inner surface of the second layer 206 or vice versa, or using another type of attachment method similar to the hook and loop method, etc. Additionally, while two layers 204 and 206 are disclosed for the hybrid brush 200, various embodiments of the disclosure may comprise three or more layers for adhesion/fastening of two layers on either side of the adhesion/fastening layer, to facilitate cleaning of a surface, longevity of the hybrid brush 200, etc.

Figure 2B:
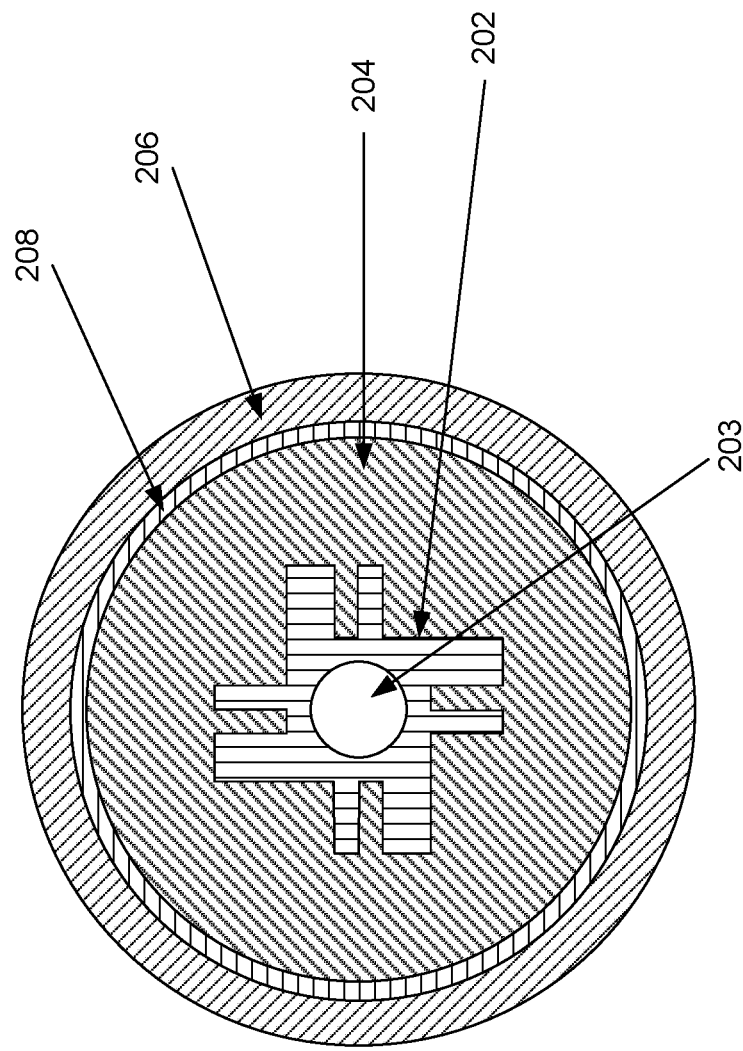
FIG. 2B illustrates a cross-section view of another example hybrid brush, in accordance with aspects of this disclosure.

FIG. 2B illustrates a cross-section view of another example hybrid brush, in accordance with aspects of this disclosure. Referring to FIG. 2B, there is shown an example hybrid brush 220 with a mandrel 202, a first layer 204, a second layer 206, and a fastening layer 208. The hybrid brush 220 may be used to implement the hybrid brush 102 in the cleaning system 100 of FIG. 1.

The hybrid brush 220 may be similar to the hybrid brush 200 of FIG. 2A except that there is a fastening layer 208 shown between the first layer 204 and the second layer 206. The fastening layer 208 may comprise, for example, adhesive layer or other material attaching the first layer to the second layer 206. For example, the fastening layer 208 may be an adhesive that fastens the first layer 204 and the second layer 206 directly. The fastening layer 208 may be one part of a 2-part (or more) adhesive, where the other of the two parts may be in a second fastening layer put on top of the first fastening layer, part of the first layer, or a part of the second layer. The fastening layer 208 may also be, for example, material that melts an outer portion of the first layer so that a second layer can be slipped on top of the first layer. When the melted portion solidifies, the first layer may then be securely adhered to the second layer. The fastening layer 208 may also comprise barbs on one or both sides to fasten onto the first layer 204 and/or the second layer 206. The fastening layer 208 may have an adhesive on one side and barbs on the second side. The fastening layer 208 may have, for example, barbs on one or both sides to attach to loops formed on corresponding one or both of the first layer 204 and the second layer 206.

Therefore, it can be seen that the fastening layer 208 may be one or more of many different materials that can firmly attach the first layer 204 to the second layer 206. Accordingly, while some examples have been listed, various embodiments of the disclosure need not be limited by those examples.

Figure 3:
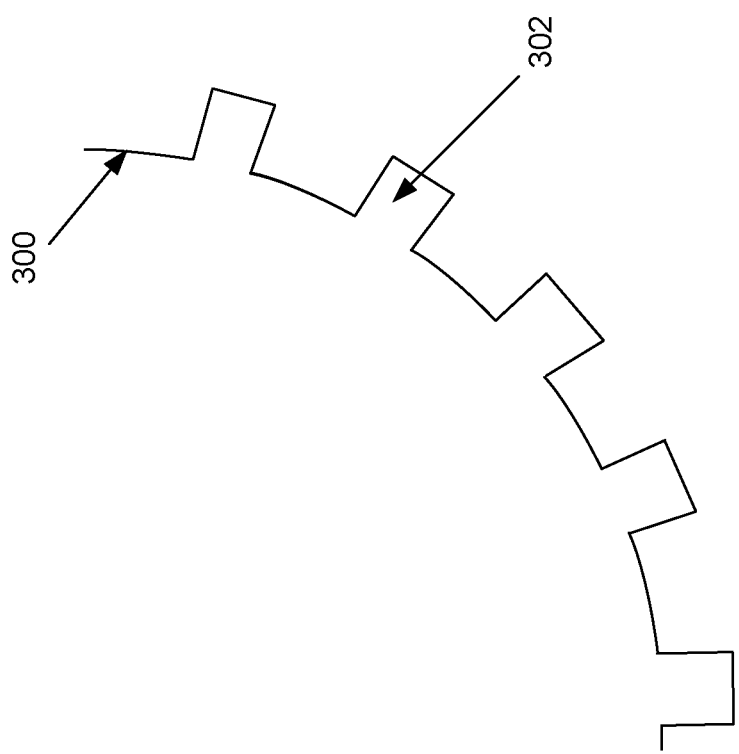
FIG. 3 illustrates an example arrangement of adjacent layers of the hybrid brush of FIG. 2A, in accordance with aspects of this disclosure.

FIG. 3 illustrates an example arrangement of adjacent layers of the hybrid brush of FIG. 2A, in accordance with aspects of this disclosure. Referring to FIG. 3, there is shown the surface 300 with protrusions 302. The surface 300 may be the outer surface of, for example, the mandrel 202 and/or the outer surface of the first layer 204. The protrusions 302 may be provided, for example, to improve fastening between the mandrel 202 and the first layer 204 and/or between the first layer 204 and the second layer 206. The protrusions 302 may taper such that the cross-section area of a base of a protrusion 302 at the surface 300 is larger than a cross-section area of the protrusion 302 above the surface 300.

The protrusions 302 may be used for various embodiments such as, for example, when the inner layer 204 is molded around the mandrel 202. Similarly, the protrusions may be used when the outer layer 206 is molded around the inner layer 204. Another embodiment may also have protrusions 302 on an outer surface of the inner layer 204 and corresponding depressions on an inner surface of an outer layer 206, where the protrusions of one surface align with and are inserted into the corresponding depressions of a counterpart surface.

The surface 300 may also be an outer surface of any other layer that may be fastened to an adjacent layer. While the protrusions may be present as shown, it should be noted that various embodiments have, more, fewer, and/or different protrusions, or omit the protrusions.

Figure 4:
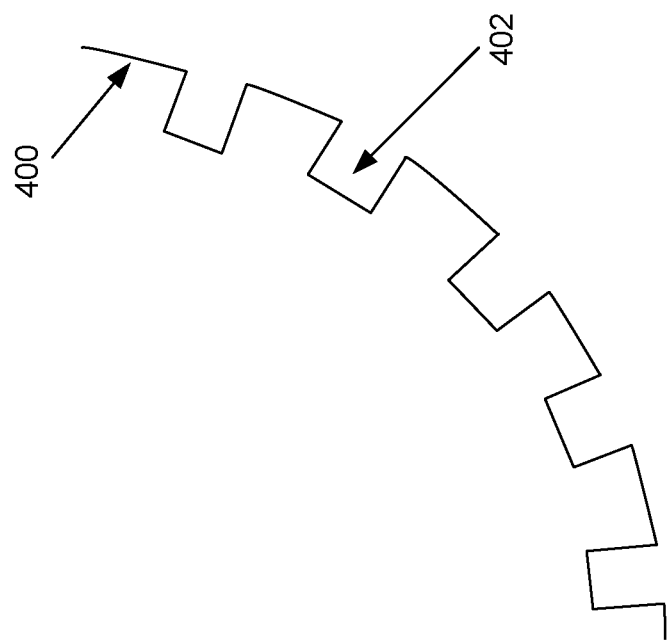
FIG. 4 illustrates another example arrangement of adjacent layers of the hybrid brush of FIG. 2A, in accordance with aspects of this disclosure.

FIG. 4 illustrates another example arrangement of adjacent layers of the hybrid brush of FIG. 2A, in accordance with aspects of this disclosure. Referring to FIG. 4, there is shown the surface 400 with depressions 402. The surface 400 may be the outer surface of, for example, the mandrel 202 and/or the outer surface of the first layer 204. The depressions 402 may be provided, for example, to facilitate fastening between the mandrel 202 and the first layer 204 and/or between the first layer 204 and the second layer 206.

The depressions 402 may be used for many embodiments such as, for example, when the inner layer 204 is molded around the mandrel 202. Similarly, the protrusions may be used when the outer layer 206 is molded around the inner layer 204. Another embodiment may also have depressions 402 on an outer surface of an inner layer and corresponding protrusions on an inner surface of an outer layer, where the protrusions may be inserted into the corresponding depressions 402. The depressions 402 may taper such that the cross-section area of the depressions 402 at the surface 400 is larger than the cross-section area of the depressions 402 below the surface 400.

The surface 400 may also be an outer surface of any other layer that may be fastened to an adjacent layer. While the depressions 402 may be present as shown, it should be noted that various embodiments need not have any depressions.

Figure 5:
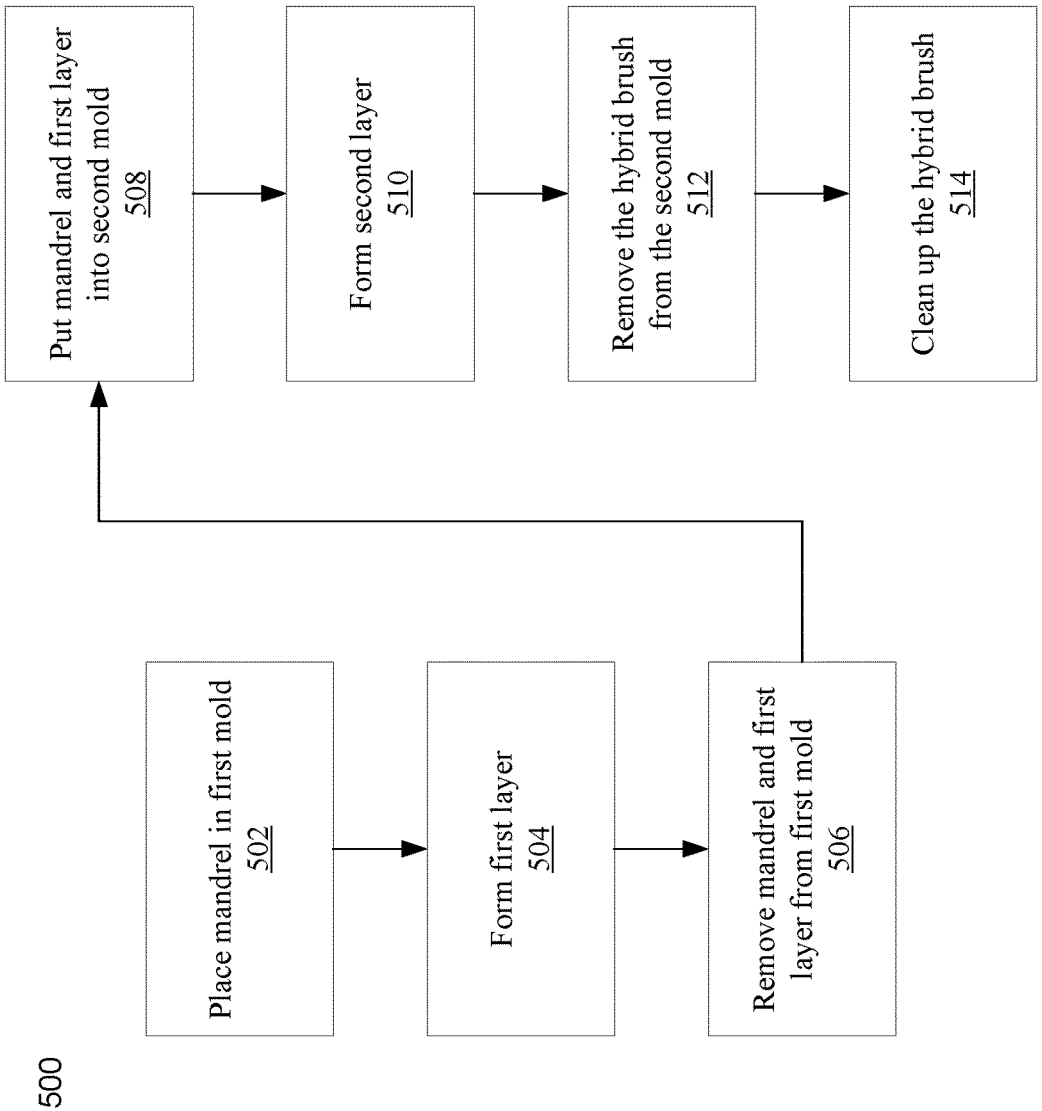
FIG. 5 illustrates a flow diagram of an example method of forming a hybrid brush, in accordance with aspects of this disclosure.

FIG. 5 illustrates a flow diagram of an example method of forming a hybrid brush, in accordance with aspects of this disclosure. Referring to FIG. 5, there is shown an example flow diagram 500 that describes forming a hybrid brush such as, for example, the hybrid brush 200 of FIG. 2A. At block 502, the mandrel 202, is placed into a first mold. At block 504, a first material is injected into the first mold to form the first layer 204. The first mold may be formed to allow an outer surface of the first layer 204 to be smooth, or to have protrusions and/or depressions. Some embodiments may form an outer surface of the first layer 204 to have both protrusions and depressions.

At block 506, the mandrel 202 and the first layer 204 are removed from the first mold. At block 506, the mandrel 202 and the first layer 204 may be treated, for example, by removing extraneous material present from the molding process that may not be desired, chemically treating the first layer 204, heat treating the first layer 204, etc., to prepare the mandrel 202 and/or the first layer 204 for putting the mandrel and the first layer into the second mold.

At block 508, the mandrel 202 and the first layer 204 are placed into a second mold. At block 510, a second material may be injected into the second mold to form the second layer 206. The second material may be denser than the first material, or less compressible than the first material. The second mold may be formed to allow an outer surface of the second layer 206 to be smooth, or to have protrusions and/or depressions. Some embodiments may form an outer surface of the second layer 206 to have both protrusions and depressions.

At block 512, the hybrid brush 200 with the first and second layers 204 and 206 may be removed from the second mold. At block 514, the hybrid brush 200 may be, for example, cleaned up by removing extraneous material present from the molding process that may not be desired in a finished hybrid brush.

In some embodiments, the first material may comprise a first polyvinyl acetate formulation and the second material may comprise a second polyvinyl acetate formulation. In other embodiments, the first material may be a material other than a polyvinyl acetate formulation, while the second material may be a polyvinyl acetate formulation. Additionally, the first and/or the second material, as the case may be, may be replaced with other material(s) that is suitable for the cleaning process for which the hybrid brush 200 is intended.

Furthermore, the first layer may have characteristics such that a substantially similar force is needed to compress the first layer when it is dry as when it is wet with a cleaning fluid used for cleaning a surface of the substrate, or a surface of another object.

Figure 6:
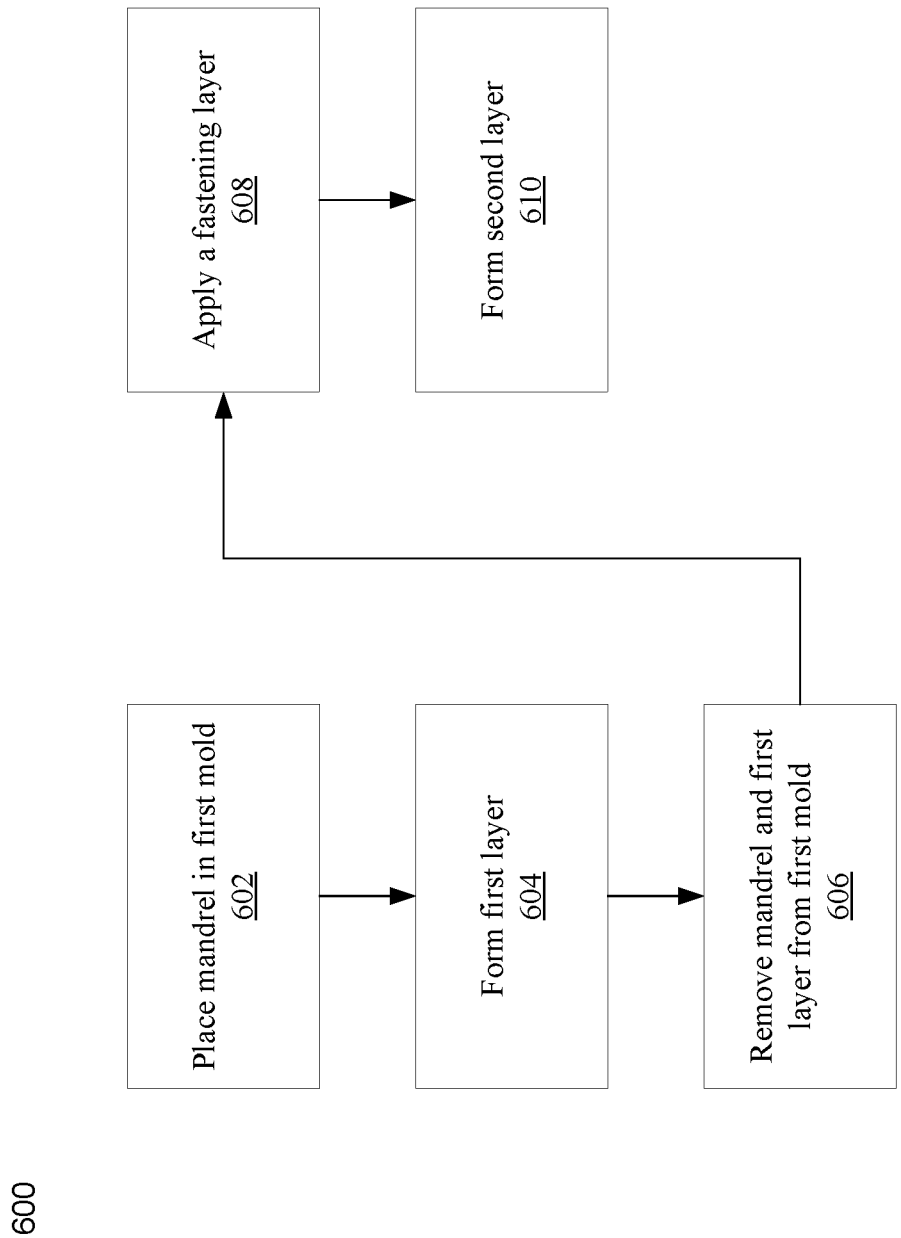
FIG. 6 illustrates a flow diagram of an example method of forming a hybrid brush, in accordance with aspects of this disclosure.

FIG. 6 illustrates a flow diagram of an example method of forming a hybrid brush, in accordance with aspects of this disclosure. Referring to FIG. 6, there is shown an example flow diagram 400 that describes forming a hybrid brush such as, for example, the hybrid brush 220 of FIG. 2B. At block 602, a mandrel 202 is placed into a first mold. At block 604, a first material is injected into the first mold to form the first layer 204. The first mold may be formed to allow an outer surface of the first layer 204 to be smooth, to have protrusions, or to have depressions. Some embodiments may form an outer surface of the first layer to have both protrusions and depressions. At block 606, the mandrel 202 and the first layer 204 are removed from the first mold.

At block 608, a fastening layer 208 is put on the first layer 204. At block 610, a second layer 206 may be secured to the first layer via the fastening layer 208. The fastening layer 208 may be, for example, a layer of adhesive or any other material suitable for firmly fastening the first layer 204 to the second layer 206.

There may be additional processes such as, for example, cleaning/trimming excess material from the first layer 204 when the mandrel 202 and the first layer 204 are removed from the first mold. Another embodiment may comprise using a second mold, much as with respect to FIG. 5, after the fastening layer 208 is put on the first layer 204. Still another embodiment may comprise putting the fastening layer 208 on an inner surface of the second layer 206 if the second layer 206 is pre-formed to be put onto the first layer 204.

Figure 7:
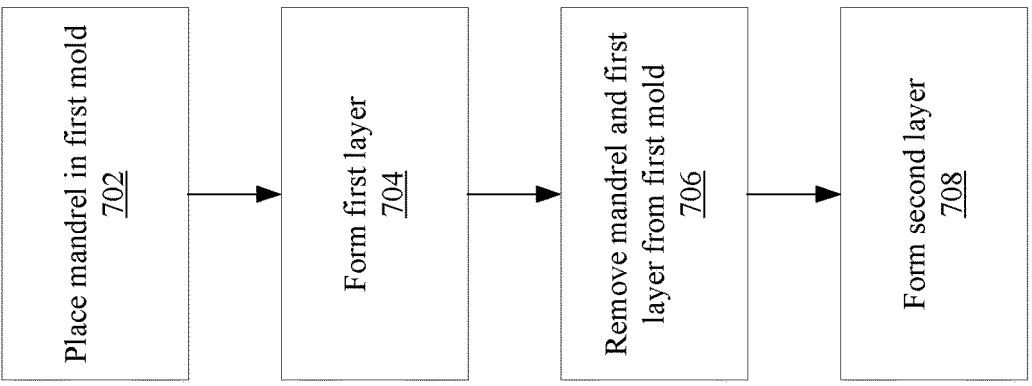
FIG. 7 illustrates a flow diagram of an example method of forming a hybrid brush, in accordance with aspects of this disclosure.

FIG. 7 illustrates a flow diagram of an example method of forming a hybrid brush, in accordance with aspects of this disclosure. The flow diagram 700 describes a process similar to FIG. 6, except that the fastening layer is not used. Rather, the second layer 206 is put directly on to the first layer 204. The second layer 206 may be, for example, a tubular shape that is slid on the first layer 204, or wrapped around the first layer 204 and fastened in place by adhering one end of the material for the second layer 206 to the other end, or by sewing the second layer 206 to the first layer 204, etc.

Figure 8:
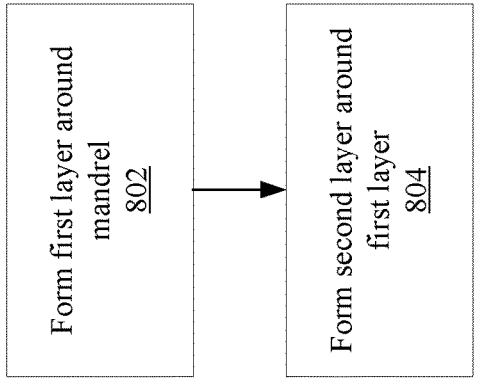
FIG. 8 illustrates a flow diagram of an example method of forming a hybrid brush, in accordance with aspects of this disclosure.

FIG. 8 illustrates a flow diagram of an example method of forming a hybrid brush, in accordance with aspects of this disclosure. FIG. 8 describes a process where molding is not used. At block 802, the first layer 204 may be placed about the mandrel 202 similarly as the second layer 206 was described to be put around the first layer 204 in FIG. 7. At block 804, the second layer 206 may be put on the first layer 204 using any appropriate method including those described above.

Additionally, various embodiments of the disclosure may use any combination of steps described previously. For example, the first layer 204 may be put around the mandrel 202 as in FIG. 8, and the second layer 206 may be molded around the first layer 204, etc. Additionally, although not shown, the molding process and or the forming process of the various layers may be under machine control, where the machine may execute instructions stored in memory.

While some methods of forming the hybrid brush were described, it should be noted that various embodiments of the disclosure may use other suitable methods that have not been described to form the hybrid brush.

An aspect of the disclosure may be a hybrid brush for cleaning a surface, comprising a mandrel, a first layer that is molded about the mandrel, wherein the first layer comprises a first material, and a second layer molded about the first layer, where the second layer comprises a second material. The molded first layer may compress under less force than the molded second layer. The molded first layer may not comprise a starch templating agent while the molded second layer may comprise a starch templating agent. A respective outer surface of the molded first layer and/or the molded second layer may be substantially free of protrusions. Various embodiments may have a respective outer surface of the molded first layer and/or the molded second layer with protrusions and/or depressions. The molded first layer may comprise larger pores than the molded second layer. The molded first layer may have a first pore distribution that is different than a second pore distribution for the molded second layer.

The thickness of the molded first layer may be independent of the thickness of the molded second layer. The first material may comprise a first polyvinyl acetate formulation and the second material may comprise a second polyvinyl acetate formulation. There may be a third layer between the first layer and the second layer, where the third layer may facilitate securing the molded first layer to the molded second layer.

A force to compress the molded first layer may be substantially the same when the molded first layer is dry as when it is wet with a cleaning fluid used for cleaning the surface.

An aspect of the disclosure may be a method for forming a brush for cleaning a substrate, comprising placing a mandrel in a first mold, forming a first layer around the mandrel by injecting a first material into the first mold, removing the mandrel with the first layer from the first mold, placing the mandrel with the first layer into a second mold, and forming the second layer surrounding the first layer by injecting a second material into the second mold.

The method may further comprise forming a third layer surrounding the first layer, prior to forming the second layer. The first mold may form depressions on an outer surface of the first layer. A first cross-section area of each of the depressions at the outer surface of the first layer may be smaller than a second cross-section area of each of the depressions below the outer surface of the first layer.

The first layer may compress under less force than the second layer. The first material may comprise a first polyvinyl acetate formulation and the second material may comprise a second polyvinyl acetate formulation. In some embodiments, the first material may not comprise polyvinyl acetate formulation while the second material may comprise polyvinyl acetate formulation. In some embodiments, the first material may not have a starch templating agent. In some embodiments, the second material may have a starch templating agent.

The first layer may comprise larger pores than the second layer. The thickness of the first layer may be independent of the thickness of the second layer. A respective outer surface of the first layer and/or the second layer may be substantially free of protrusions. Other embodiments may have a respective outer surface of the first layer and/or the second layer have protrusions and/or depressions. The method may also comprise treating the first layer after the mandrel and the first layer are removed from the first mold.

An embodiment of the present methods and systems utilize hardware, software, and/or a combination of hardware and software. For example, hardware and/or software may be utilized to control making a hybrid brush, testing suitability of the hybrid brush, and/or analyzing effluents to determine effectiveness of the hybrid brush in usage. Any kind of computing system or other apparatus adapted for carrying out the methods described herein is suited. A typical combination of hardware and software may include a general-purpose computing system with a program or other code that, when being loaded and executed, controls the computing system such that it carries out the methods described herein. Another typical implementation may comprise one or more application specific integrated circuit or chip. Some implementations may comprise a non-transitory machine-readable (e.g., computer readable) medium (e.g., FLASH memory, optical disk, magnetic storage disk, or the like) having stored thereon one or more lines of code executable by a machine, thereby causing the machine to perform processes as described herein. As used herein, the term "non-transitory machine-readable medium" is defined to include all types of machine readable storage media and to exclude propagating signals.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or." As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g." and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What are claimed:

1. A hybrid brush for cleaning a surface, comprising:
   a mandrel, wherein the mandrel defines a central opening configured to receive an axle;
   a non-molded first layer placed around the mandrel, wherein the first layer comprises a first material; and
   a molded second layer molded about the non-molded first layer, wherein the molded second layer comprises a second material.

2. The hybrid brush of claim 1, wherein the non-molded first layer compresses under less force than the molded second layer.

3. The hybrid brush of claim 1, wherein the non-molded first layer does not comprise a starch templating agent and the molded second layer comprises a starch templating agent.

4. The hybrid brush of claim 1, wherein a respective outer surface of one or both of the non-molded first layer and the molded second layer is substantially free of protrusions.

5. The hybrid brush of claim 1, wherein the first material comprises a first polyvinyl acetate formulation and the second material comprises a second polyvinyl acetate formulation.

6. The hybrid brush of claim 1, wherein a force to compress the non-molded first layer is substantially the same when the non-molded first layer is dry as when the non-molded first layer is wet with a cleaning fluid used for cleaning the surface.

7. The hybrid brush of claim 1, wherein a first pore distribution for the non-molded first layer is different than a second pore distribution for the molded second layer.

8. The hybrid brush of claim 1, wherein a thickness of the non-molded first layer is independent of the thickness of the molded second layer.

9. The hybrid brush of claim 1, further comprising a third layer between the non-molded first layer and the molded second layer.

10. A method for forming a hybrid brush for cleaning a surface, comprising:
    placing a non-molded first layer comprising a first material around a mandrel, wherein the mandrel defines a central opening configured to receive an axle;
    placing the mandrel with the non-molded first layer into a mold; and
    forming a second layer surrounding the non-molded first layer by injecting a second material into the mold.

11. The method of claim 10, further comprising forming a third layer surrounding the non-molded first layer, prior to forming the second layer.

12. The method of claim 10, wherein an outer surface of the non-molded first layer comprises depressions.

13. The method of claim 12, wherein a first cross-section area of each of the depressions at an outer surface of the non-molded first layer is smaller than a second cross-section area of each of the depressions below the outer surface of the non-molded first layer.

14. The method of claim 10, wherein the non-molded first layer compresses with less force than the second layer.

15. The method of claim 10, wherein the first material does not comprise polyvinyl acetate formulation.

16. The method of claim 10, wherein the second material comprises a starch templating agent.

17. The method of claim 10, wherein the first material does not comprise a starch templating agent.

18. The method of claim 10, wherein the non-molded first layer comprises larger pores than the second layer.

19. The method of claim 10, comprising treating the non-molded first layer prior to putting the mandrel and the non-molded first layer into the mold.

20. The method of claim 10, wherein a respective outer surface of one or both of the non-molded first layer and the second layer is substantially free of protrusions.

* * * * *